United States Patent
Choi et al.

(10) Patent No.: US 8,008,683 B2
(45) Date of Patent: Aug. 30, 2011

(54) SEMICONDUCTOR LIGHT EMITTING DEVICE

(75) Inventors: Pun Jae Choi, Gyeonggi-do (KR); Yu Seung Kim, Gyeonggi-do (KR); Jin Bock Lee, Gyeonggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 67 days.

(21) Appl. No.: 12/406,568

(22) Filed: Mar. 18, 2009

(65) Prior Publication Data

US 2010/0096652 A1    Apr. 22, 2010

(30) Foreign Application Priority Data

Oct. 22, 2008   (KR) .................. 10-2008-0103671

(51) Int. Cl.
    *H01L 33/00*   (2010.01)
(52) U.S. Cl. ............... 257/99; 257/98; 257/E33.065
(58) Field of Classification Search .......... 257/98, 257/99, E31.124, 79, E33.062, E33.065, 257/E33.066
See application file for complete search history.

(56) References Cited

U.S. PATENT DOCUMENTS

| 6,278,136 B1 * | 8/2001 | Nitta ................. 257/99 |
| 6,828,596 B2 * | 12/2004 | Steigerwald et al. ........ 257/99 |
| 6,995,401 B2 * | 2/2006 | Yamada et al. .............. 257/79 |
| 7,592,637 B2 * | 9/2009 | Zimmerman et al. ......... 257/98 |
| 2008/0191215 A1 | 8/2008 | Choi et al. |
| 2008/0237619 A1 * | 10/2008 | Epler et al. ................. 257/98 |
| 2008/0237622 A1 | 10/2008 | Choi et al. |

FOREIGN PATENT DOCUMENTS

| KR | 10-0188466 B1 | 4/2008 |
| KR | 10-0849826 B1 | 7/2008 |
| KR | 10-0887072 B1 | 2/2009 |
| KR | 10-0891761 B1 | 3/2009 |
| KR | 2009-0062619 A | 6/2009 |
| WO | WO 2009/075551 A2 | 6/2009 |

OTHER PUBLICATIONS

International Search Report issued in International Patent Application No. PCT/KR2009/006144 dated May 31, 2010.

* cited by examiner

*Primary Examiner* — Tom Thomas
*Assistant Examiner* — Eduardo A Rodela
(74) *Attorney, Agent, or Firm* — McDermott Will & Emery LLP

(57) ABSTRACT

The present invention provides a semiconductor light emitting device including a conductive substrate, a first electrode layer, an insulating layer, a second electrode layer, a second semiconductor layer, an active layer, and a first semiconductor layer which are sequentially stacked, wherein an area where the first electrode layer and the first semiconductor layer are in contact with each other is 3 to 13% of an area of the semiconductor light emitting device.

11 Claims, 4 Drawing Sheets

[FIG. 1]
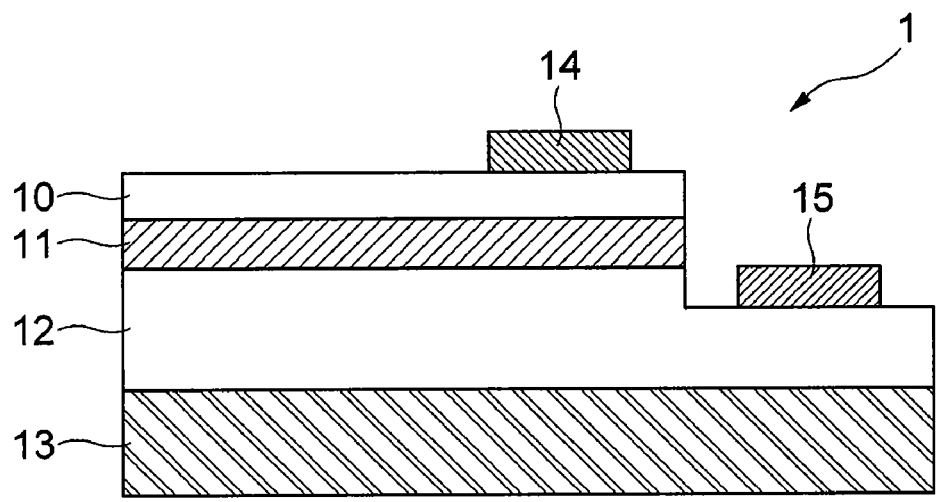
- PRIOR ART -
[FIG. 2]
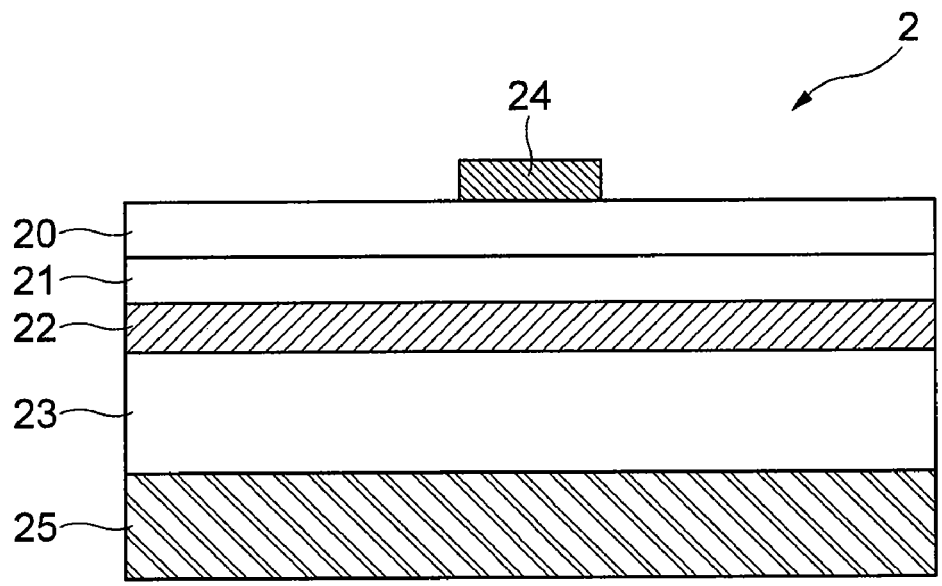
- PRIOR ART -

[FIG. 3]
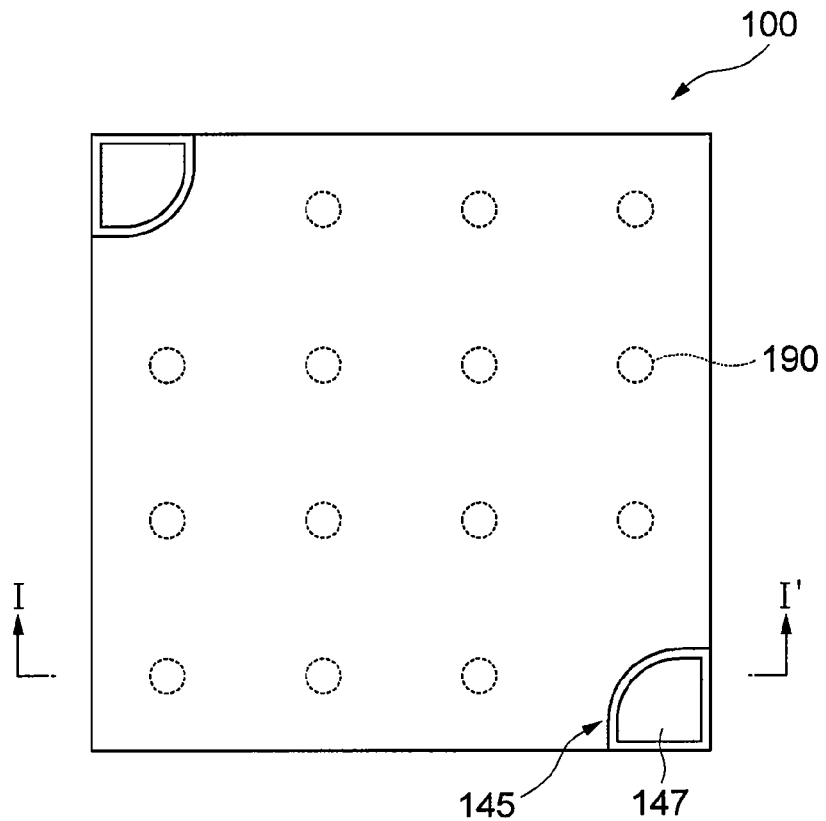
[FIG. 4]
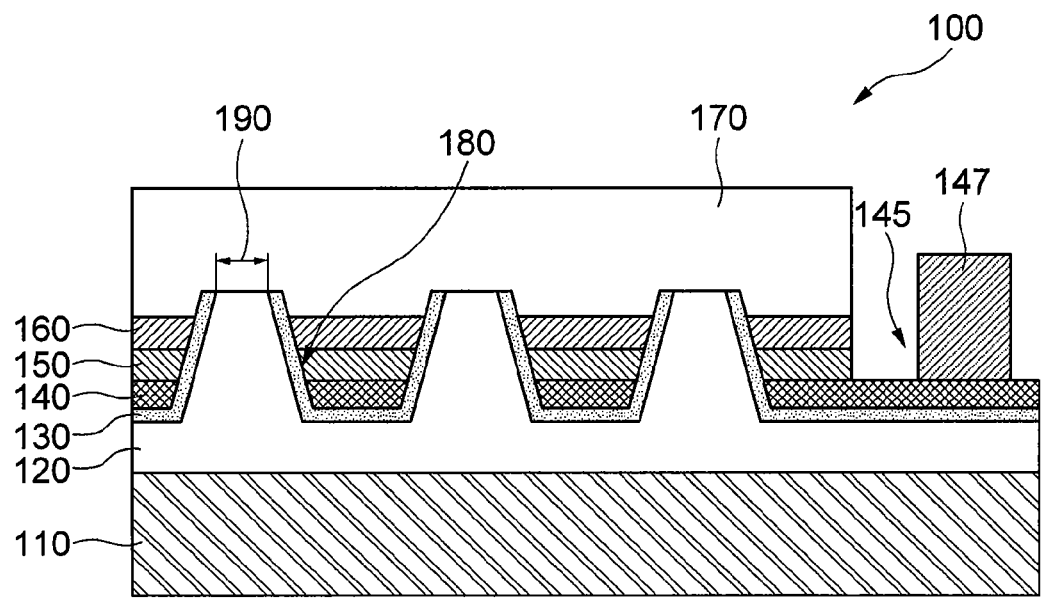

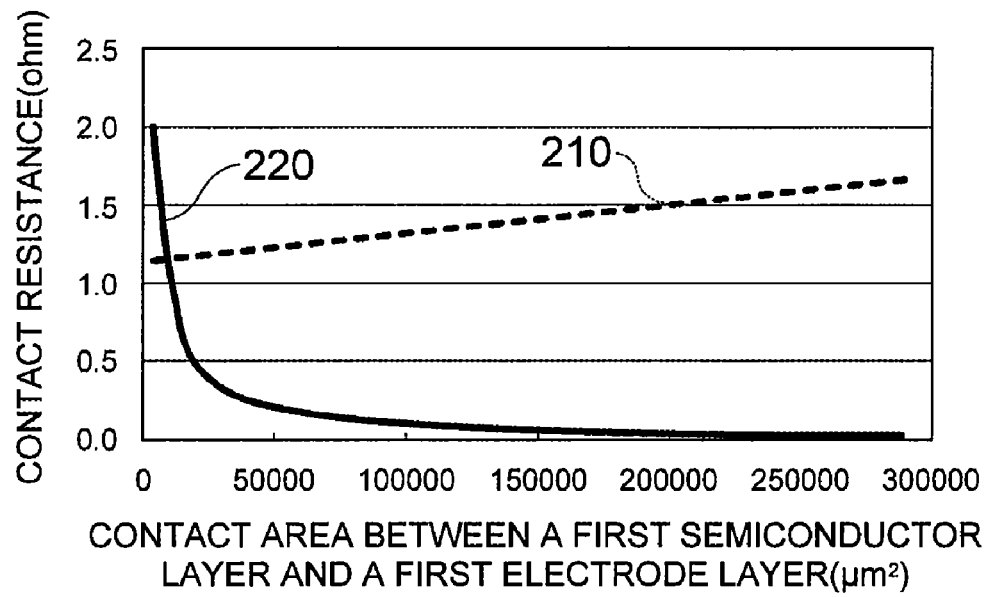
[FIG. 5]
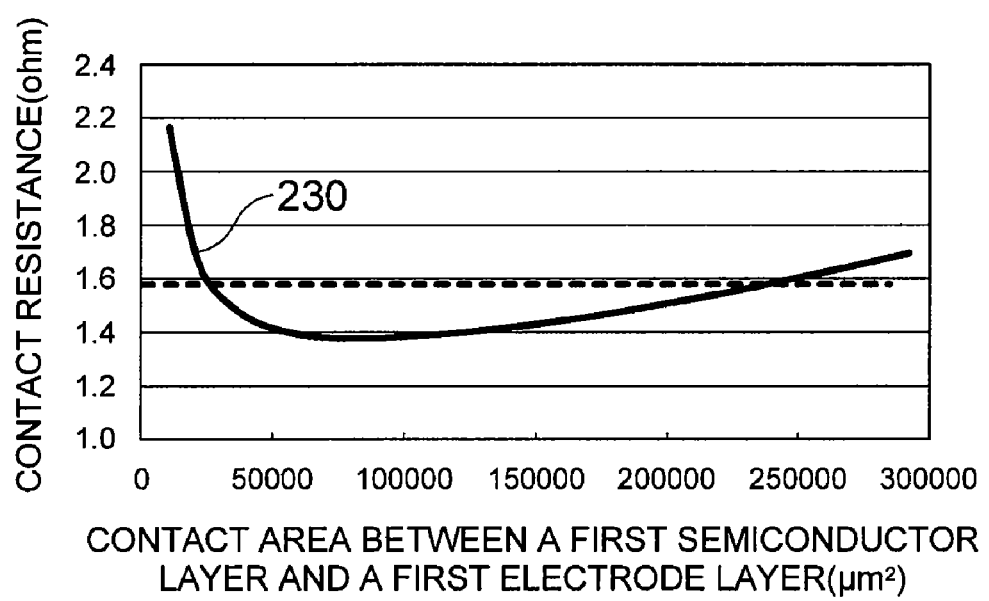
[FIG. 6]

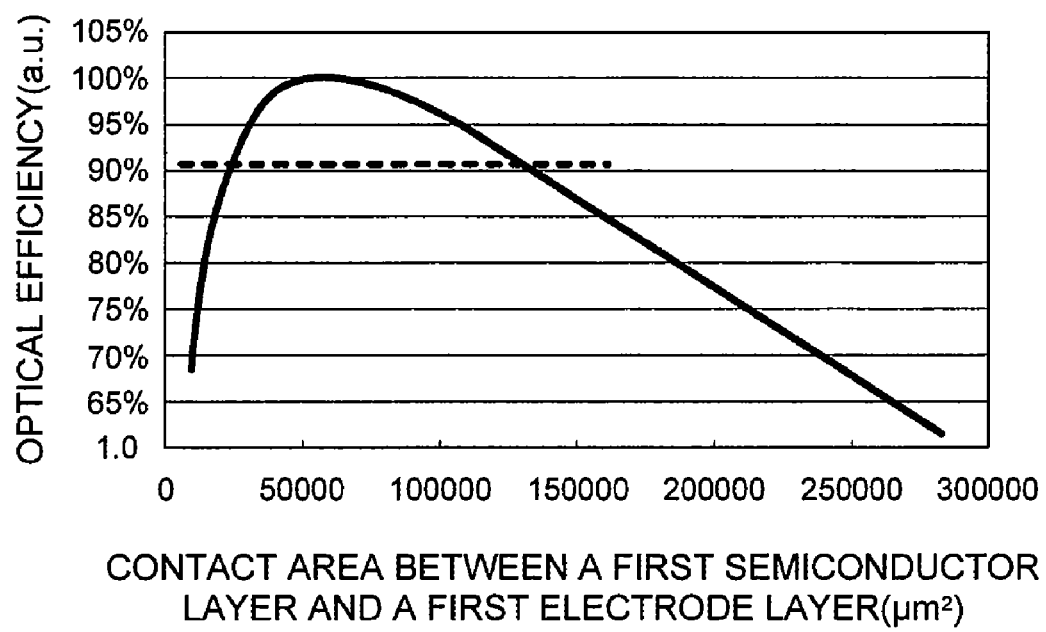

SEMICONDUCTOR LIGHT EMITTING DEVICE

CROSS-REFERENCE TO RELATED APPLICATIONS

This application claims the benefit of Korean Patent Application No. 10-2008-0103671 filed with the Korea Intellectual Property Office on Oct. 22, 2008, the disclosure of which is incorporated herein by reference.

BACKGROUND OF THE INVENTION

1. Field of the Invention

The present invention relates to a semiconductor light emitting device; and, more particularly, to a semiconductor light emitting device capable of performing an operation at a high current and improving luminous efficiency by changing an arrangement structure of electrodes.

2. Description of the Related Art

Semiconductor light emitting devices contain materials emitting light inside. For example, LEDs (Light Emitting Diodes) are devices that use diodes, to which semiconductors are bonded, convert energy generated by recombination of electrons and holes into light, and emit the light. The semiconductor light emitting devices are being widely used as lighting, display devices, and light sources and the development thereof has been expedited.

In general, semiconductor junction light emitting devices have junction structures of p-type semiconductors and n-type semiconductors. In the junction structures of the semiconductors, light can be emitted by recombination of electrons and holes at junction regions of both types of semiconductors and further an active layer may be formed between both types of semiconductors in order to activate the light emission. The semiconductor junction light emitting devices have vertical structures and horizontal structures according to positions of electrodes for semiconductor layers and the horizontal structure includes an epi-up structure and a flip-chip structure.

FIG. 1 is a view showing a horizontal semiconductor light emitting device according to the related art and FIG. 2 is a cross-sectional view showing a vertical semiconductor light emitting device according to the related art. For the convenience of explanation, in FIGS. 1 and 2, a description will be made on the assumption that an n-type semiconductor layer is in contact with a substrate and a p-type semiconductor layer is formed on an active layer.

First, a horizontal semiconductor light emitting device will be described with reference to FIG. 1.

A horizontal semiconductor light emitting device 1 includes a non-conductive substrate 13, an n-type semiconductor layer 12, an active layer 11, and a p-type semiconductor layer 10. An n-type electrode 15 and a p-type electrode 14 are formed on the n-type semiconductor layer 12 and the p-type semiconductor layer 10, respectively and are electrically connected to an external current source (not shown) to apply a voltage or the like.

When the voltage is applied to the semiconductor light emitting device 1 through the electrodes 14 and 15, electrons move from the n-type semiconductor layer 12, and holes move from the p-type semiconductor layer 10, which results in recombination of the electrons and the holes to emit light. The semiconductor light emitting device 1 includes the active layer 11 and the light is emitted from the active layer 11. In the active layer 11, the light emission of the semiconductor light emitting device 1 is activated and the light is emitted. In order to make an electrical connection, the n-type electrode and the p-type electrode are positioned on the n-type semiconductor layer 12 and the p-type semiconductor layer 10, respectively, with the lowest contact resistance values.

The positions of the electrodes may be varied according to a substrate type. For instance, in case that the substrate 13 is a sapphire substrate that is a non-conductive substrate as shown in the drawing, the electrode of the n-type semiconductor layer 12 cannot be formed on the non-conductive substrate 13, but can be formed on the n-type semiconductor layer 12.

Therefore, when the n-type electrode 15 is formed on the n-type semiconductor 12, parts of the p-type semiconductor layer 10 and the active layer 11 that are formed at an upper side are consumed to form an ohmic contact portion. Because the electrodes are formed in this way, a light emitting area of the semiconductor light emitting device 1 is reduced, and thus luminous efficiency also decreases.

In order to address various problems including the above-described problem, a semiconductor light emitting device that uses a conductive substrate, not the non-conductive substrate, has appeared.

A semiconductor light emitting device 2 shown in FIG. 2 is a vertical semiconductor light emitting device. Since a conductive substrate 23 is used, an n-type electrode 25 can be formed on the substrate. Although, as shown in FIG. 2, the n-type electrode is formed on the conductive substrate 23, it is also possible to manufacture a vertical light emitting device by growing semiconductor layers by using a non-conductive substrate, removing the substrate, and then directly forming an n-type electrode on the n-type semiconductor layer.

When the conductive substrate 23 is used, because a voltage can be applied to an n-type semiconductor layer 22 through the conductive substrate 23, an electrode can be directly formed on the substrate.

Therefore, as shown in FIG. 2, the n-type electrode 25 is formed on the conductive substrate 23 and a p-type electrode 24 is formed on a p-type semiconductor 20, thereby manufacturing a semiconductor light emitting device having a vertical structure.

However, in this case, particularly, in case that a high-power light emitting device having a large area is manufactured, an area ratio of the electrode to the substrate needs to be high for current spreading. As a result, light extraction is limited, light loss is caused due to optical absorption, and luminous efficiency is reduced.

The horizontal and vertical semiconductor light emitting devices, which are described with reference to FIGS. 1 and 2, reduce the light emitting area to thereby reduce the luminous efficiency, limit the light extraction, cause the light loss due to the optical absorption, and reduce the luminous efficiency.

For this reason, a semiconductor light emitting device having a new structure needs to be urgently developed in order to solve the problems of the conventional semiconductor light emitting devices.

SUMMARY OF THE INVENTION

The present invention has been invented in order to overcome the above-described problems and it is, therefore, an object of the present invention to provide a semiconductor light emitting device having a new structure.

Further, another object of the present invention is to provide a semiconductor light emitting device with high luminous efficiency.

Further, still another object of the present invention is to provide a high current semiconductor light emitting device.

In accordance with one aspect of the present invention to achieve the objects, there is provided a semiconductor light emitting device including: a conductive substrate, a first electrode layer, an insulating layer, a second electrode layer, a second semiconductor layer, an active layer, and a first semiconductor layer which are sequentially stacked, wherein the second electrode layer includes at least one region where a portion of an interface in contact with the second semiconductor layer is exposed, the first electrode layer penetrates the second electrode layer, the second semiconductor layer, and the active layer and is electrically connected to the first semiconductor layer by being extended to predetermined regions of the first semiconductor layer through a plurality of contact holes which penetrate the predetermined regions of the first semiconductor layer, the insulating layer insulates the first electrode layer from the second electrode layer, the second semiconductor layer and the active layer by being formed between the first electrode layer and the second electrode layer and on side surfaces of the contact holes, and an area where the first electrode layer and the first semiconductor layer are in contact with each other is 3 to 13% of an area of the semiconductor light emitting device.

Further, the contact holes are uniformly arranged.

Further, the number of the contact holes is 5 to 50.

Further, a contact area between the first electrode layer and the semiconductor layer for the area of 1,000,000 $\mu m^2$ of the semiconductor light emitting device is 30,000 to 130,000 $\mu m^2$.

Further, a distance between central points of adjacent contact holes among the contact holes is 100 to 400 μm.

Further, the semiconductor light emitting device further includes an electrode pad unit which is formed on an exposed region of the second electrode layer.

Further, the exposed region of the second electrode layer is formed at a corner of the semiconductor light emitting device.

Further, the second electrode layer reflects light generated from the active layer.

Further, the second electrode layer includes any one of Ag, Al, and Pt.

Further, the conductive substrate is a metallic substrate including any one of Au, Ni, Cu, and W.

Further, the conductive substrate includes any one of Si, Ge, and GaAs.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a view showing a horizontal semiconductor light emitting device according to the related art;

FIG. 2 is a cross-sectional view showing a vertical semiconductor light emitting device according to the related art;

FIG. 3 is a plane-view illustrating a semiconductor light emitting device in accordance with one embodiment of the present invention;

FIG. 4 is a cross-sectional view illustrating a semiconductor light emitting device in accordance with one embodiment of the present invention;

FIG. 5 is a graph illustrating n-type ohmic contact resistance and p-type ohmic contact resistance of a semiconductor light emitting device having an area of 1,000×1,000 $\mu m^2$;

FIG. 6 is a graph illustrating the total resistance of first contact resistance and second contact resistance according to a contact area between a first semiconductor layer and a first electrode layer; and FIG. 7 is a graph illustrating luminous efficiency according to the contact area between the first semiconductor layer and the first electrode layer.

DETAILED DESCRIPTION OF THE PREFERABLE EMBODIMENTS

Hereinafter, embodiments of the present invention for a semiconductor light emitting device will be described in detail with reference to the accompanying drawings. The following embodiments are provided as examples to fully convey the spirit of the invention to those skilled in the art. Therefore, the present invention should not be construed as limited to the embodiments set forth herein and may be embodied in different forms and. And, the size and the thickness of an apparatus may be overdrawn in the drawings for the convenience of explanation. The same component is represented by the same reference numeral hereinafter.

FIGS. 3 and 4 are a plane-view and a cross-sectional view illustrating a semiconductor light emitting device in accordance with one embodiment of the present invention. At this time, FIG. 4 is a cross-sectional view taken along a line I-I' shown in FIG. 3.

Referring to FIGS. 3 and 4, a semiconductor light emitting device 100 in accordance with one embodiment of the invention includes a conductive substrate 110, a first electrode layer 120, an insulating layer 130, a second electrode layer 140, a second semiconductor layer 150, an active layer 160, and a first semiconductor layer 170 that are sequentially stacked.

The conductive substrate 110 may be formed of a material which allows electricity to flow. For example, it is preferable that the conductive substrate 110 is a metallic substrate which is formed of any one of metals, such as Au, Ni, Cu, and W, or a semiconductor substrate which is formed of any one of Si, Ge, and GaAs.

The first electrode layer 120 is stacked on the conductive substrate 110, wherein because the first electrode layer 120 is electrically connected to the conductive substrate 110 and the active layer 160, it is preferable that the first electrode layer 120 is formed of a material which can minimize contact resistance with the conductive substrate 110 and the active layer 160.

The first electrode layer 120 is stacked on the conductive substrate 110 and further some regions thereof, as shown in FIG. 4, penetrate the insulating layer 130, the second electrode layer 140, the second semiconductor layer 150 and the active layer 160 and are in contact with the first semiconductor layer 170 by being extended through contact holes 180 which penetrate predetermined regions of the first semiconductor layer 170, whereby the conductive substrate 110 and the first semiconductor layer 170 are electrically connected.

That is, the first electrode layer 120 electrically connects the conductive layer 110 to the first semiconductor layer 170 through the contact holes 180. They are electrically connected through sizes of the contact holes 180, more exactly, contact regions 190 that are areas where the first electrode layer 120 and the first semiconductor layer 170 are contact with each other through the contact holes 180.

Meanwhile, the insulating layer 130 is formed on the first electrode layer 120 to electrically insulate the first electrode layer 120 from other layers except for the conductive substrate 110 and the first semiconductor layer 170. In other words, the insulating layer 130 is formed not only between the first and second electrode layers 120 and 140 but between side surfaces of the second electrode layer 140, the second semiconductor layer 150 and the active layer 160 which are exposed by the contact holes 180, and the first electrode layer 120. Further, it is preferable that the insulating layer 120 is formed on side surfaces of predetermined regions of the first semiconductor layer 170 which the contact holes 180 penetrate to achieve insulation.

The second electrode layer 140 is formed on the insulating layer 130. Undoubtedly, as described above, the second electrode layer 140 does not exist on the predetermined regions which the contact holes 180 penetrate.

At this time, the second electrode layer 140, as shown in the drawing, includes at least one region where a portion of an interface in contact with the second semiconductor layer 150 is exposed, i.e., an exposed region 145. An electrode pad unit 147 may be formed on the exposed region 145 to connect an external current source to the second electrode layer 140. Meanwhile, the second semiconductor layer 150, the active layer 160, and the first semiconductor layer 170, which will be described later, are not formed on the exposed region 145. Further, preferably, the at least one exposed region 145, as shown in FIG. 3, is formed at corners of the semiconductor light emitting device 100 in order to maximize a light emitting area of the semiconductor light emitting device 100.

Meanwhile, it is preferable that the second electrode layer 140 is formed of any one metal of Ag, Al, and Pt. This is because the second electrode layer 140 is preferably formed of a layer which has a characteristic to minimize contact resistance with the semiconductor layer 150 because the second electrode layer 140 is in electrical contact with the second semiconductor layer 150, and has a function to improve luminous efficiency by reflecting light generated from the active layer 160 to be directed outward.

The second semiconductor layer 150 is formed on the second electrode layer 140, the active layer 160 is formed on the second semiconductor layer 150, and the first semiconductor layer 170 is formed on the active layer 160.

At this time, it is preferable that the first semiconductor layer 170 is an n-type nitride semiconductor and the second semiconductor layer 150 is a p-type nitride semiconductor.

Meanwhile, the active layer 160 may be formed by selecting different materials according to materials of which the first and second semiconductor layers 170 and 150 are formed. Namely, since the active layer 160 is a layer where energy generated by recombination of electrons and holes is converted into light and the light is emitted, it is preferable that the active layer 160 is formed of a material having a smaller energy band gap than those of the first semiconductor layer 170 and the second semiconductor layer 150.

FIG. 5 is a graph illustrating n-type ohmic contact resistance and p-type ohmic contact resistance of a semiconductor light emitting device having an area of $1,000 \times 1,000$ μm$^2$.

Referring to FIG. 5, assuming the semiconductor light emitting device 100 in accordance with one embodiment of the present invention is a rectangular chip having a size of 1,000,000 μm$^2$, that is, a width is 1,000 μm and a height is 1,000, resistance of the semiconductor light emitting device 100 includes the first electrode layer 120, the second electrode layer 140, the first semiconductor layer 170, the second semiconductor layer 150, contact resistance between the second semiconductor layer 150 and the second electrode layer 140 (hereinafter referred to as first contact resistance), and contact resistance between the first semiconductor layer 170 and the first electrode layer 120 (hereinafter referred to as second contact resistance), wherein major changes are made to the first contact resistance 210 and the second contact resistance 220 according to a contact area.

In particular, as shown in FIG. 5, as the contact area increases, more change is made to the second contact resistance 220 compared to the first contact resistance 210. At this time, an X axis shown in FIG. 5 represents the size of the contact area where the first semiconductor layer 170 and the first electrode layer 120 are in contact with each other and a Y axis represents contact resistance values and therefore figures of the X axis represent contact areas where the first semiconductor layer 170 and the first electrode layer 120 are in contact with each other. As for a contact area between the second semiconductor layer 150 and the second electrode layer 140, a value obtained by subtracting a value of the X axis from the total area (1,000,000 μm$^2$) of the semiconductor light emitting device 100 corresponds to the contact area between the second semiconductor layer 150 and the second electrode layer 140 which corresponds to the first contact resistance 210.

At this time, the contact area between the first semiconductor layer 170 and the first electrode layer 120 indicates the total area of the contact regions 190 where the first electrode layer 120 and the first semiconductor layer 170 are in contact with each other through the contact holes 180 as described with reference to FIGS. 3 and 4, i.e., the sum total of areas of the contact regions 190 because the contact holes 180 are plural.

FIG. 6 is a graph illustrating the total resistance of the first contact resistance and the second contact resistance according to the contact area between the first semiconductor layer and the first electrode layer.

Referring to FIG. 6, since the first contact resistance 210 and the second contact resistance 220 of the semiconductor light emitting device 100 in accordance with the one embodiment of the present invention are connected to each other in series, the total resistance 230 obtained by adding the first contact resistance 210 and the second contact resistance 220 among the resistance of the semiconductor light emitting device 100 is most deeply influenced by the contact area.

At this time, as shown in FIG. 6, it is found that as the contact area (referring to the value of the X axis) between the first semiconductor layer 170 and the first electrode layer 120 increases, the total resistance 230 (referring to the value of Y axis) rapidly decreases at an early stage and as the contact area between the first semiconductor layer 170 and the first electrode layer 120 further increases, the total resistance 230 tends to increase.

Meanwhile, in case that the size of the semiconductor light emitting device 100 is 1,000,000 μm$^2$, because it is preferable that the resistance of the semiconductor light emitting device 100 is below 1.6 ohm, it is preferable that the contact area between the first semiconductor layer 170 and the first electrode layer 120 is 30,000 to 250,000 μm$^2$.

That is, in the semiconductor light emitting device 100 of the present invention as described with reference to FIGS. 3 and 4, it is most preferable in terms of contact resistance that the total contact area of the contact regions 190 where the first electrode layer 120 and the first semiconductor layer 170 are in contact with each other through the contact holes 180 is 30,000 to 250,000 μm$^2$.

FIG. 7 is a graph illustrating luminous efficiency according to the contact area between the first semiconductor layer and the first electrode layer.

As described with reference to FIG. 6, when the contact area between the first semiconductor layer 170 and the first electrode layer 120 is 30,000 to 250,000 μm$^2$, the total resistance is low and so luminous efficiency of the semiconductor light emitting device 100 is likely to be high, however, at this time, it is not considered that as the contact area between the first semiconductor layer 170 and the first electrode layer 120 increases, a light emitting area of the semiconductor light emitting device 100 is practically reduced.

That is, as shown in FIG. 7, the luminous efficiency of the semiconductor light emitting device 100 increases by reducing the total resistance until the contact area between the first semiconductor layer 170 and the first electrode layer 120 is 70,000 m$^2$, however, when the contact area between the first semiconductor layer 170 and the first electrode layer 120 continuously increases above 70,000 μm$^2$, the luminous efficiency gets lower, wherein the increase in the contact area between the first semiconductor layer 170 and the first electrode layer 120 indicates the decrease in the contact area between the second semiconductor layer 150 and the second electrode layer 140, which reduces a light-emitting amount of the semiconductor light emitting device 100.

Therefore, it is preferable that the contact area between the first semiconductor layer 170 and the first electrode layer 120 is appropriately determined, that is, the contact area between the first semiconductor layer 170 and the first electrode layer 120 is preferably below 130,000 μm$^2$ so that the luminous efficiency is above 90% as shown in FIG. 7.

In conclusion, it is most preferable that in the semiconductor light emitting device 100 in accordance with the one embodiment of the present invention, the contact area between the first semiconductor layer 170 and the first electrode layer 120 through the contact holes 180 is 30,000 to 130,000 μm$^2$. Since the semiconductor light emitting device 100 corresponds to a case where the size of chip is 1,000,000 μm$^2$, the contact area between the first electrode layer 170 and the semiconductor layer 120 that is 3 to 13% of the area of the semiconductor light emitting device 100, is the most proper contact area.

Meanwhile, if the number of the contact holes 180 is very small, a contact area between the first semiconductor layer 170 and the first electrode layer 120 for each of the contact regions 190 between the first semiconductor layer 170 and the first electrode layer 120 increases, and so an area of the first semiconductor layer 170 to which a current needs to be supplied increase, whereby a current which should be supplied to the contact regions 190 increases. This causes current-crowding effect at the contact regions 190 between the first semiconductor 170 and the first electrode layer 120.

In addition, if the number of the contact holes 180 is very large, the size of each of the contact holes 180 becomes very smaller, thereby causing difficulty in a manufacture process.

Therefore, it is preferable that the number of the contact holes 180 is properly selected according to the size of the semiconductor light emitting device 100, i.e., the size of the chip, wherein if the size of the semiconductor light emitting device 100 is 1,000,000 μm$^2$, it is preferable that the number of the contact holes 180 is 5 to 50.

Meanwhile, when the contact holes 180 of the semiconductor light emitting device 100 are plurally formed, it is preferable that the contact holes 180 are uniformly arranged. This is because it is preferable to uniformly arrange the contact holes 180, i.e., the contact regions 190 between the first semiconductor layer 170 and the first electrode layer 120 in order to uniformly spread a current because the first semiconductor layer 170 and the first electrode layer 120 are in contact with each other through the contact holes 180.

Herein, if the size of the semiconductor light emitting device 100 is 1,000,000 μm$^2$ and the number of the contact holes 180 is 5 to 50, in order to uniformly arrange the semiconductor light emitting device 100, separation distances between adjacent contact holes among a plurality of contact holes may be 100 to 400 μm. At this time, the separation distances are values measured by connecting central points of the adjacent contact holes.

Meanwhile, the semiconductor light emitting device 100 can achieve uniform current spreading by uniformly arranging the plurality of contact holes 180. Therefore, if the size of the semiconductor light emitting device 100 is 1,000,000 μm$^2$, it operates at approximately 350 mA conventionally, while the semiconductor light emitting device 100 in accordance with the one embodiment of the present invention stably operates and prevents the current crowing effect even though a high current of approximately 2 A is applied and therefore it is possible to provide the light emitting device with improved reliability.

As described above, in the semiconductor light emitting device of the present invention, the light emitting area can be maximally secured by forming some parts of the first electrodes on a light emitting surface and positioning the other parts at a lower part of the active layer.

Further, even though the high operation current is applied, the current can stably spread by uniformly arranging the electrodes positioned on the light emitting surface.

Further, since the current can uniformly spread, the current crowing effect can be prevented at the high current operation, thereby enhancing the reliability.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A semiconductor light emitting device comprising:
a conductive substrate, a first electrode layer, an insulating layer, a second electrode layer, a second semiconductor layer, an active layer, and a first semiconductor layer which are sequentially stacked, and
an electrode pad unit disposed on an upper surface of the second electrode layer,
wherein the second electrode layer includes at least one region where a portion of an interface in contact with the second semiconductor layer is exposed,
the first electrode layer penetrates the second electrode layer, the second semiconductor layer, and the active layer and is electrically connected to the first semiconductor layer by being extended to predetermined regions of the first semiconductor layer through a plurality of contact holes which penetrate the predetermined regions of the first semiconductor layer,
the insulating layer insulates the conductive substrate and the first electrode layer from the second electrode layer, the second semiconductor layer and the active layer by being formed between the first electrode layer and the second electrode layer and on side surfaces of the contact holes.

2. The semiconductor light emitting device of claim 1, wherein the contact holes are uniformly arranged.

3. The semiconductor light emitting device of claim 2, wherein the number of the contact holes is 5 to 50.

4. The semiconductor light emitting device of claim 2, wherein a contact area between the first electrode layer and the semiconductor layer for the area of 1,000,000 μm$^2$ of the semiconductor light emitting device is 30,000 to 130,000 μm$^2$.

5. The semiconductor light emitting device of claim 2, wherein a distance between central points of adjacent contact holes among the contact holes is 100 to 400 μm.

6. The semiconductor light emitting device of claim 1, wherein the exposed region of the second electrode layer is formed at a corner of the semiconductor light emitting device.

7. The semiconductor light emitting device of claim 1, wherein the second electrode layer reflects light generated from the active layer.

8. The semiconductor light emitting device of claim 7, wherein the second electrode layer includes any one of Ag, Al, and Pt.

9. The semiconductor light emitting device of claim 1, wherein the conductive substrate is a metallic substrate including any one of Au, Ni, Cu, and W.

10. The semiconductor light emitting device of claim 1, wherein the conductive substrate includes any one of Si, Ge, and GaAs.

11. The semiconductor light emitting device of claim 1, wherein an area where the first electrode layer and the first semiconductor layer are in contact with each other is less than or the same as 13% of an area of the semiconductor light emitting device.

* * * * *